(12) United States Patent
Seefeldt

(10) Patent No.: US 6,355,537 B1
(45) Date of Patent: Mar. 12, 2002

(54) METHOD OF PROVIDING RADIO FREQUENCY ISOLATION OF DEVICE MESAS USING GUARD RING REGIONS WITHIN AN INTEGRATED CIRCUIT DEVICE

(75) Inventor: James D. Seefeldt, DeForest, WI (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/645,056

(22) Filed: Aug. 23, 2000

Related U.S. Application Data

(62) Division of application No. 09/255,747, filed on Feb. 23, 1999, now abandoned.

(51) Int. Cl.$^7$ .............................................. H01L 21/76
(52) U.S. Cl. ........................................ 438/405; 257/524
(58) Field of Search ............................... 438/424, 221, 438/296, 570, 465; 257/510, 513, 524

(56) References Cited

U.S. PATENT DOCUMENTS

| | | | |
|---|---|---|---|
| 5,144,308 A | 9/1992 | Norsworthy | 341/131 |
| 5,279,978 A | 1/1994 | See et al. | 437/34 |
| 5,294,823 A | 3/1994 | Eklund et al. | 257/370 |
| 5,424,739 A | 6/1995 | Norsworthy et al. | 341/143 |
| 5,430,317 A | 7/1995 | Onai et al. | 257/347 |
| 5,449,953 A | 9/1995 | Nathanson et al. | 257/728 |
| 5,498,885 A | 3/1996 | Deen et al. | 257/139 |

(List continued on next page.)

FOREIGN PATENT DOCUMENTS

| | | | |
|---|---|---|---|
| JP | 6053422 A | 2/1994 | H01L/27/06 |
| JP | 8241999 | 9/1996 | H01L/29/786 |
| WO | WO9702602 | 1/1997 | H01L/27/12 |

OTHER PUBLICATIONS

U.S. application No. 09/216040, Brown et al., filed Dec. 18, 1998.
U.S. application No. 09/272822, Seefeldt, filed Mar. 19, 1999.
U.S. application No. 09/305330, Brown et al., filed May 4, 1999.

(List continued on next page.)

*Primary Examiner*—Charles Bowers
*Assistant Examiner*—David S Blum
(74) *Attorney, Agent, or Firm*—Martin J. Jaquez, Esq.; Jaquez & Associates

(57) ABSTRACT

A semiconductor integrated circuit (IC) device includes a substrate, an insulating layer formed on the substrate, a buried layer formed on the insulating layer, and an epitaxial layer of a first conductivity type formed on the buried layer. A first isolation trench is formed in the epitaxial layer and the buried layer that extends to the insulating layer and that surrounds a first selected surface area of the epitaxial layer. A second isolation trench is formed in the epitaxial layer and the buried layer that extends to the insulating layer and that surrounds the first isolation trench and defines a guard ring region between itself and the first isolation trench. A collector is implanted into the epitaxial layer in the guard ring region. A contact is made to the collector, and a conductor connects the contact to a ground node. A method of forming a semiconductor IC device includes: forming a silicon-on-insulator (SOI) substrate having an insulating layer formed on a substrate; forming a buried layer on the insulating layer; forming an epitaxial layer of a first conductivity type on the buried layer; forming a first isolation trench in the epitaxial layer and the buried layer that extends to the insulating layer and that surrounds a first selected surface area of the epitaxial layer; forming a second isolation trench in the epitaxial layer and the buried layer that extends to the insulating layer and that surrounds the first isolation trench and defines a guard ring region between itself and the first isolation trench; implanting a collector into the epitaxial layer in the guard ring region; establishing a contact to the collector; and connecting the contact to a ground node.

7 Claims, 9 Drawing Sheets

U.S. PATENT DOCUMENTS

| | | | | |
|---|---|---|---|---|
| 5,578,970 | A | 11/1996 | Nguyen et al. | 331/75 |
| 5,619,069 | A | 4/1997 | Ohta et al. | 257/692 |
| 5,643,805 | A | 7/1997 | Ohta et al. | 437/31 |
| 5,644,157 | A | 7/1997 | Iida et al. | 257/521 |
| 5,661,329 | A | 8/1997 | Hiramoto et al. | 257/510 |
| 5,684,482 | A | 11/1997 | Galton | 341/144 |
| 5,745,061 | A | 4/1998 | Norsworthy et al. | 341/131 |
| 5,773,340 | A | 6/1998 | Kumauchi et al. | 438/234 |

OTHER PUBLICATIONS

IEEE Personal Communications, "Figure 3. A Wireless–enhanced scenario for PCCAs", Dec. 1998, p. 1.

Kikuchi, et al., "A 0.35µm ECL–CMOS Process Technology on SOI for 1ns Mega–bits SRAM s with 40ps Gate Array", International Electronic Devices Meeting Technical Digest, 95:923–926 (Dec. 1995).

Sze, S.M., "Semiconductor Devices, Physics and Technology", New Jersey, John Wiley & Sons, 1985, pp 468–472, ISBN 0–471–87424–8.

Bluetooth Special Interest Group website http://www.bluetooth.com; "Bluetooth–Document Page", including Technology Overview, "Baseband", "Link Management", "Software Framework", "PC General", "Telephone", "Others"; Dated Unknown; pp. 1–10.

Durec, Jeff, "An Integrated Silicon Bipolar Receiver Subsystem for 900–Mhz ISM Band Applications", IEEE Journal of Solid State Circuits, 33(9):1352–1372 (Sep., 1998).

Hashimoto, et al., "A 6–$\mu$ m$^2$ bipolar transistor using 0.25–$\mu$ m process technology for high–speed applications", IEEE Proceedings of the Bipolar BiCMOS Circuits and Technology Meeting, 152–155, Sep. 1998.

METHOD OF PROVIDING RADIO FREQUENCY ISOLATION OF DEVICE MESAS USING GUARD RING REGIONS WITHIN AN INTEGRATED CIRCUIT DEVICE

CROSS-REFERENCE TO RELATED APPLICATIONS

This application is a divisional of U.S. application Ser. No. 09/255,747, filed Feb. 23, 1999, now abandoned entitled "Trench Isolated Guard Ring Region for Providing RF Isolation", abandoned.

BACKGROUND OF THE INVENTION

1. Field of the Invention

The present invention relates to isolation techniques in semiconductor integrated circuits, and more particularly, to isolation techniques in silicon-on-insulator integrated circuits and isolation of radio frequency (RF) signals in silicon-on-insulator integrated circuits.

2. Description of the Related Art

In semiconductor electronics, the general trend is smaller and smaller form factors with improved performance and lower cost. In order to reduce form factors, more circuitry must be packed into less wafer real estate. As inter-device spacing shrinks, at some point adjacent elements of the circuitry begin to interact with each other, reducing their performance. The basic measurement parameter that characterizes this effect is called isolation. High isolation, and in particular, high RF isolation, implies that devices can be spaced closer together, and die size is minimized. Minimum size in turn implies placement in smaller packaging and less space used on the application PCB Board. Also, since wafer processing costs are nearly independent of the chip size, smaller circuits imply more die per wafer and thus a lower per die cost.

Isolation is a key parameter particularly important for analog integrated circuits (ICs). For example, isolation is important for ICs used in wireless communications applications. In general, wireless communications devices use high-frequency signals: 900 MHz to 1900 MHz for cellular phones and higher (up to 6 GHz) for other systems, such as wireless LANs. The proposed Bluetooth standard calls for operation in the unlicensed ISM band at 2.4 GHz. Signals at such frequencies, i.e., high radio frequencies (RF), are difficult to generate and control. They also have a tendency to interfere with each other, as they are easily coupled by parasitic properties present in all electronic components, including ICs. In ICs, many of the undesirable parasitic effects result from the conductive silicon substrate on which the circuits are fabricated. Poor isolation in a receiver, for example, can lead to an amount of local oscillator (LO) signal appearing at the output of the receiver and effectively be transmitted at the antenna. Wireless regulatory authorities limit the amount of spurious signal that can be radiated by the receiver, so limiting the amount of LO radiation is necessary to meet these specifications.

One type of semiconductor technology that is finding more use in bipolar applications is Silicon-On-Insulator (SOI). With SOI, an insulating layer separates circuit devices from the solid silicon substrate. An example of one particular SOI technology is the bonded SOI BiCMOS process technology that is available from Hitachi Ltd. of Japan, and specifically, the Hitachi Ltd. Device Development Center in Tokyo, Japan. This SOI BiCMOS process technology is also described in U.S. Pat. No. 5,661,329 entitled "Semiconductor Integrated Circuit Device Including An Improved Separating Groove Arrangement", U.S. Pat. No. 5,773,340 entitled "Method of Manufacturing a BIMIS", and U.S. Pat. No. 5,430,317 entitled "Semiconductor Device", the complete disclosures of which are all hereby fully incorporated into the present application by reference. Furthermore, this SOI BiCMOS process technology is also described in the paper entitled "A 0.35 um ECL-CMOS Process Technology on SOI for 1 ns Mega-bits SRAM's with 40 ps Gate Array" by T. Kikuchi, Y. Onishi, T. Hashimoto, E. Yoshida, H. Yamaguchi, S. Wada, N. Tamba, K. Watanabe, Y. Tamaki, and T. Ikeda of the Hitachi Ltd. Device Development Center, Tokyo, Japan, published in the IEDM Technical Digest, IEDM 95–923, in connection with the International Electron Devices Meeting, Dec. 10–13, 1995, 0-7803-2700-4, 1995 IEEE, the complete disclosure of which is hereby fully incorporated into the present application by reference. An SOI process technology is also described in the paper entitled "A 6 um 2 bipolar transistor using 0.25-um process technology for high-speed applications" by T. Hashimoto, T. Kikuchi, K. Watanabe, S. Wada, Y. Tamaki, M. Kondo, N. Natsuaki, and N. Owada of the Hitachi Ltd. Device Development Center, Tokyo, Japan, published in IEEE BCTM 9.1, 0-7803-4497-9/98, 1998 IEEE, the complete disclosure of which is hereby fully incorporated into the present application by reference.

Two types of substrate isolation techniques have heretofore been employed in SOI (such as the bonded SOI BiCMOS process technology available from Hitachi Ltd.). The first is guard rings, and the second is $SiO_2$ trench isolation. Guard rings are substrate contacts that enclose the area to be isolated. Dielectric trench isolation structures provide lateral barriers between circuit elements. These techniques isolate signals and minimize the undesired coupling that would otherwise limit performance for closely spaced adjacent circuit elements.

U.S. Pat. No. 5,661,329 discloses an element separating groove arrangement formed to surround active regions to be formed with a semiconductor element. One disadvantage of this separating groove arrangement is that external RF power can still pass through the separating grooves to the active region. Specifically, the separating groove arrangement described in the '329 patent appears to be intended primarily for yield improvement and not for RF isolation. The '329 patent does not appear to address the problem of RF isolation and appears to show no intent to terminate electric fields created by RF power.

Thus, there is a need for an apparatus and method that provides improved RF isolation on SOI process technology.

BRIEF SUMMARY OF THE INVENTION

The present invention provides a semiconductor integrated circuit (IC) device that includes a substrate, an insulating layer formed on the substrate, and additional semiconductor layers formed on the insulating layer. A first isolation trench is formed in the additional semiconductor layers that extends to the insulating layer and that surrounds a first selected surface area of the additional semiconductor layers. A second isolation trench is formed in the additional semiconductor layers that extends to the insulating layer and that surrounds the first isolation trench and defines a guard ring region between itself and the first isolation trench. A ground conductor couples the guard ring region to a ground node.

The present invention also provides a semiconductor integrated circuit (IC) device that includes a substrate, an insulating layer formed on the substrate, a buried layer formed on the insulating layer, and an epitaxial layer of a first conductivity type formed on the buried layer. A first isolation trench is formed in the epitaxial layer and the buried layer that extends to the insulating layer and that surrounds a first selected surface area of the epitaxial layer. A second isolation trench is formed in the epitaxial layer and the buried layer that extends to the insulating layer and that surrounds the first isolation trench and defines a guard ring region between itself and the first isolation trench. A collector is implanted into the epitaxial layer in the guard ring region. A contact is made to the collector, and a conductor connects the contact to a ground node.

The present invention also provides a semiconductor integrated circuit (IC) device that includes a silicon-on-insulator (SOI) substrate having an insulating layer formed on a substrate. A guard ring is formed on a surface of the insulating layer which surrounds a first selected surface area of the insulating layer. The guard ring has a lower buried layer region in contact with the surface of the insulating layer and an upper collector region. First and second oxide filled isolation trenches are formed substantially perpendicular to and in contact with the surface of the insulating layer which sandwich and isolate the guard ring therebetween. A contact is made to the upper collector region of the guard ring, and a conductor connects the contact to a ground node.

The present invention also provides a method of forming a semiconductor integrated circuit (IC) device. The method includes: forming a silicon-on-insulator (SOI) substrate having an insulating layer formed on a substrate; forming a buried layer on the insulating layer; forming an epitaxial layer of a first conductivity type on the buried layer; forming a first isolation trench in the epitaxial layer and the buried layer that extends to the insulating layer and that surrounds a first selected surface area of the epitaxial layer; forming a second isolation trench in the epitaxial layer and the buried layer that extends to the insulating layer and that surrounds the first isolation trench and defines a guard ring region between itself and the first isolation trench; implanting a collector into the epitaxial layer in the guard ring region; establishing a contact to the collector; and connecting the contact to a ground node.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

One purpose of the present invention is to improve device to device isolation (such as RF power isolation) between devices included on a single Silicon-On-Insulator (SOI) substrate. Such isolation allows integration of, for example, numerous RF components that operate at a high power level on the same silicon substrate with low RF power leakage between components. Greater than 80dB of isolation is possible at 2 GHz for 200 um of device separation using the teachings of the present invention.

Figure 1:
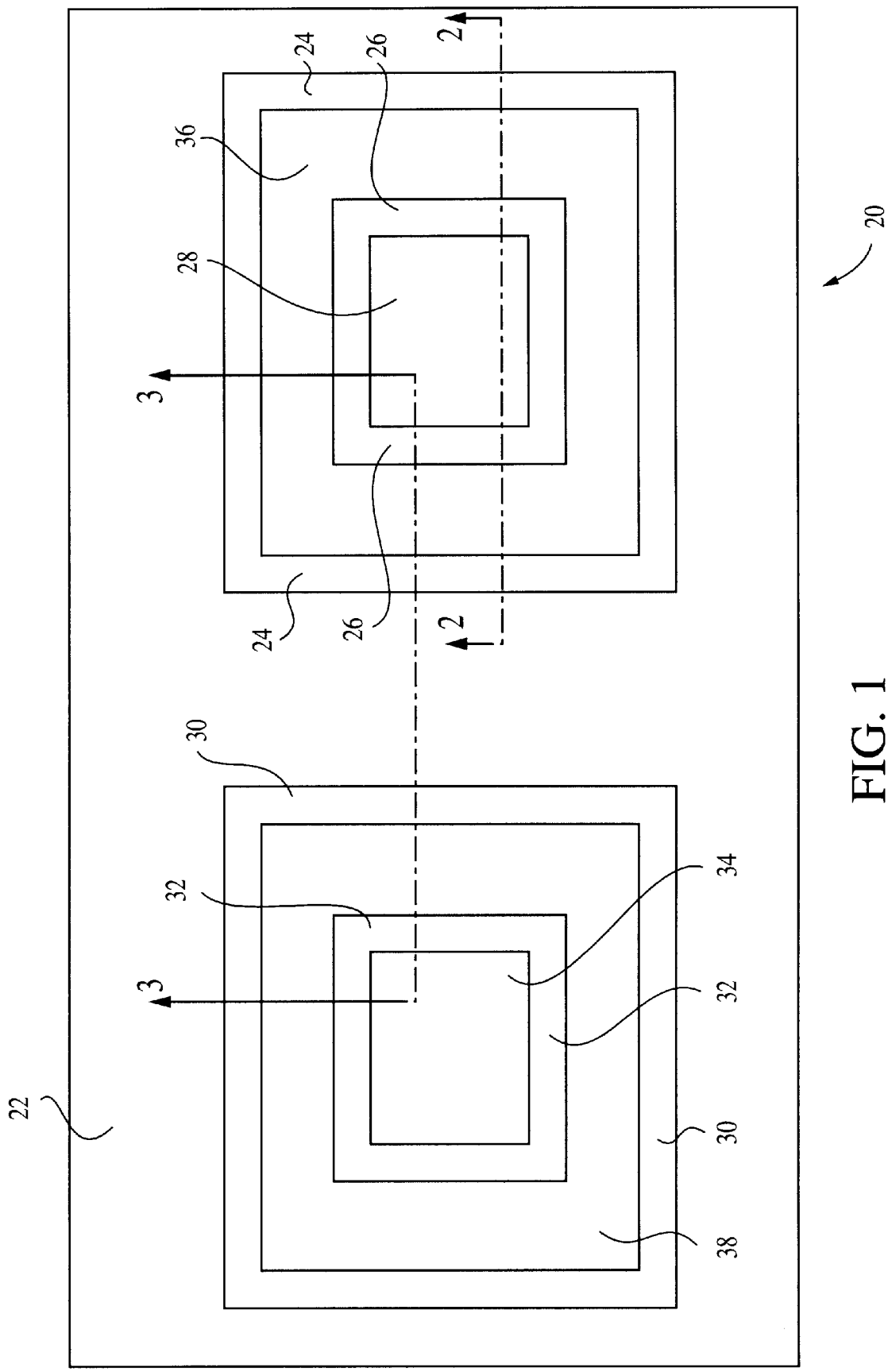
FIG. 1 is a top plan view illustrating a semiconductor integrated circuit in accordance with the present invention.

Referring to FIG. 1, there is illustrated a semiconductor integrated circuit (IC) 20 in accordance with the present invention. The IC 20 preferably includes a single SOI substrate 22, but it should be understood that the teachings of the present invention can be applied to non-SOI substrates as well. The SOI substrate 22 includes two isolation trenches 24, 26 that isolate a first device mesa 28 and two isolation trenches 30, 32 that isolate a second device mesa 34. The isolation trenches 24, 26 define a first guard ring region 36 therebetween, and the isolation trenches 30, 32 define a second guard ring region 38 therebetween. The isolation trenches 24, 26, 30, 32 may be filled with silicon oxide or some other material, such as for example, oxide/polysilicon. It should be understood that the first and second device mesas 28, 34 may comprise many different types of devices, such as for example, transistors, diodes, capacitors, etc. Furthermore, any number of devices, device mesas, and trenches may be included on the SOI substrate 22.

Figure 2:
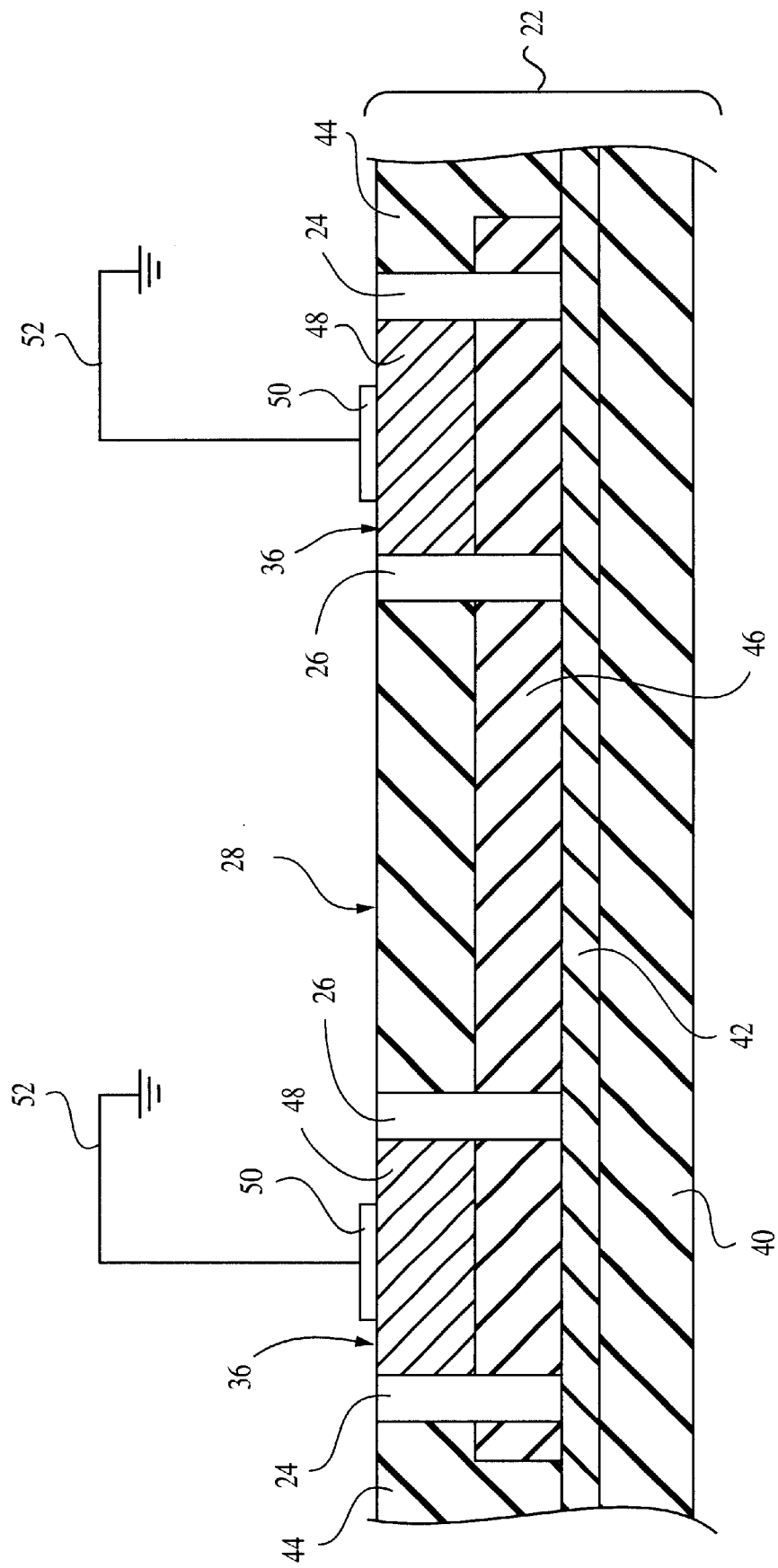
FIG. 2 is a sectional view illustrating the semiconductor integrated circuit of FIG. 1 taken along line 2—2.

Referring to FIG. 2, the SOI substrate 22 includes a silicon support substrate 40 and an insulating layer 42 that separates the first device mesa 28 from the silicon support substrate 40. By way of example, the support substrate 40 may be formed of a p$^-$-type semiconductor substrate of a silicon single crystal, and the insulating layer 42 may be formed of a silicon oxide film, also referred to as SOI oxide. The support substrate 40 is preferably formed of a high resistivity (or high Z) substrate having a high ohm per centimeter rating, such as for example, a 1 K$\Omega$ per centimeter substrate. While a 1 K$\Omega$ per centimeter substrate performs very well, it should be understood that a substrate is considered herein to be a high resistivity (or high Z) substrate if it has an ohm per centimeter rating above approximately 100$\Omega$ per centimeter. The first guard ring region 36 surrounds the first device mesa 28 and is isolated from the first device mesa 28 by isolation trench 26. Isolation trench 24 isolates the first guard ring region 36 from the surrounding field epitaxial region 44. An n-type buried layer (NBL) 46 extends into the first guard ring region 36, and an n-type collector (CN) 48 is implanted into the first guard ring region 36. The CN 48 is preferably heavily doped. Metal contacts 50 are made to the n-type collector 48 of the first guard ring region 36 to provide a low resistance RF ground along conductors 52. The conductors 52 are preferably coupled to an RF ground node. It should be understood that the first and second guard ring regions 36, 38, as well as the buried layer 46 and the collector 48, may also be formed from p-type material.

Figure 3:
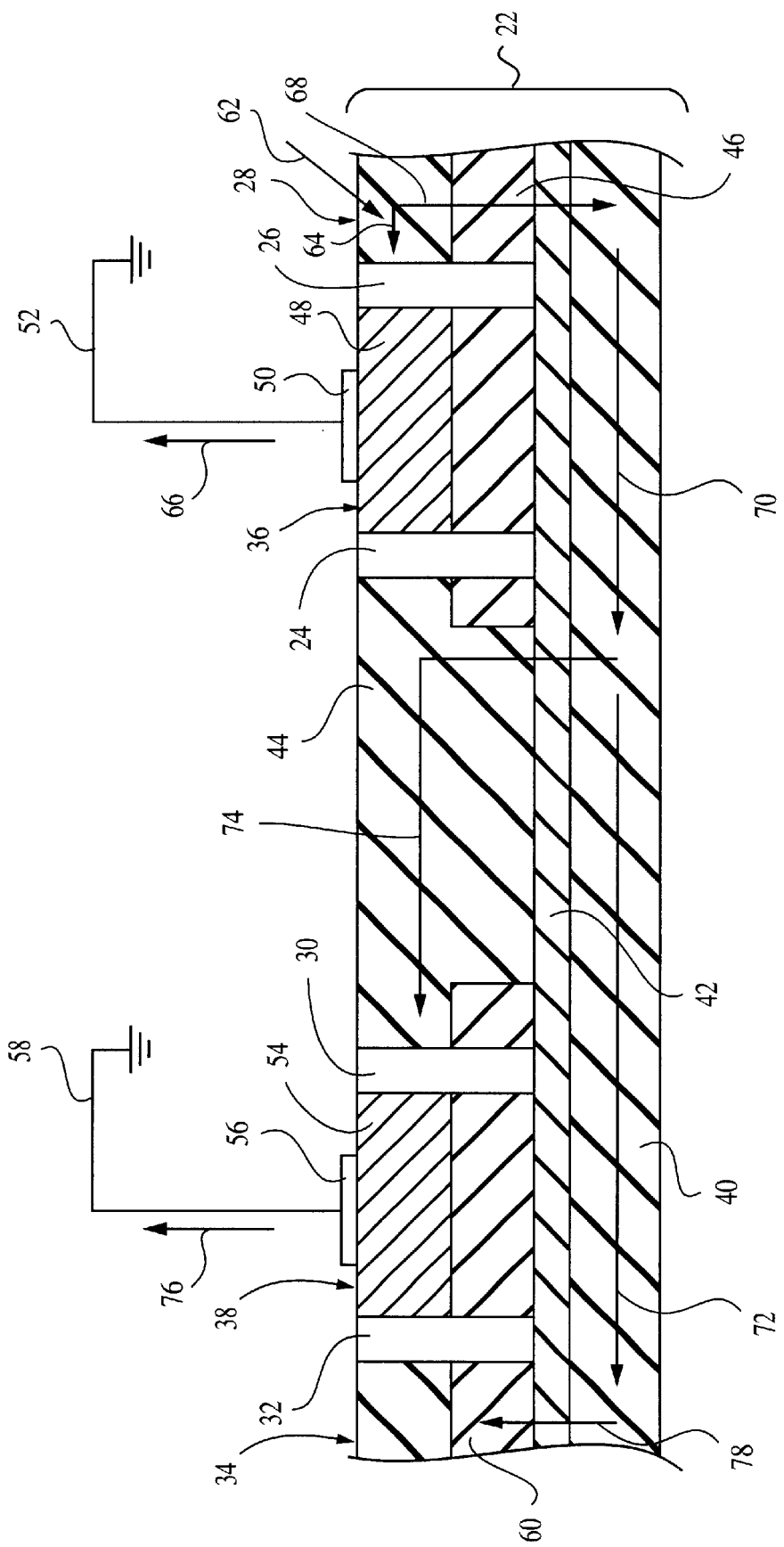
FIG. 3 is a sectional view illustrating the semiconductor integrated circuit of FIG. 1 taken along line 3—3.
Figure 4:
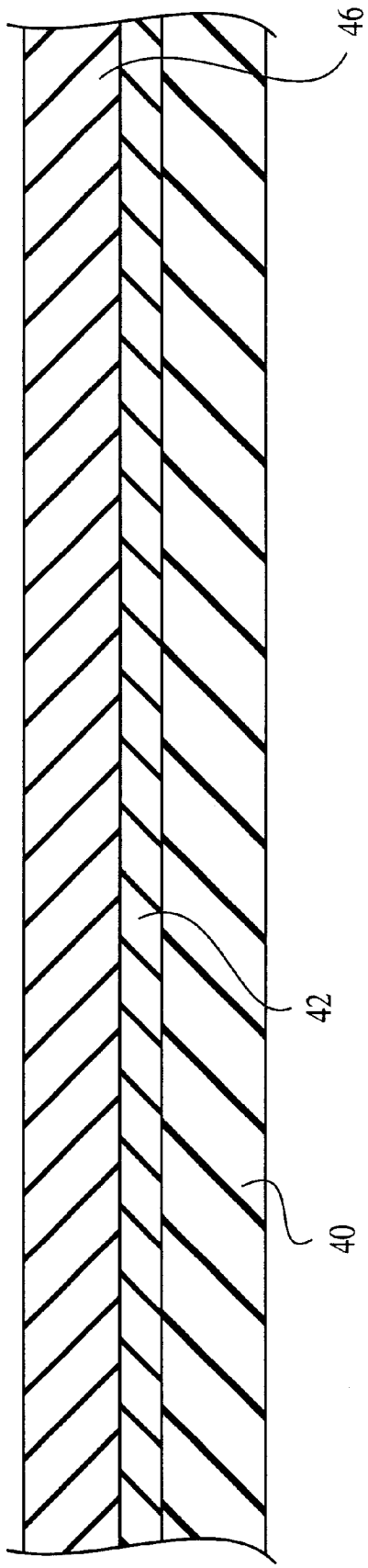
FIGS. 4–8 are sectional views illustrating a method of manufacturing the section of the semiconductor integrated circuit shown in FIG. 2.
Figure 5:
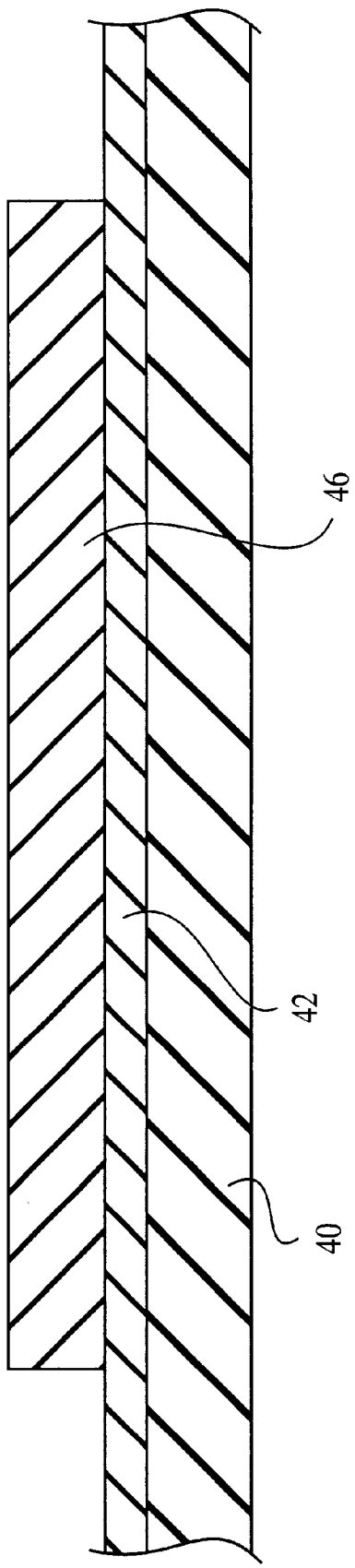

Referring to FIG. 3, the second guard ring region 38 surrounds the second device mesa 34 and is isolated from the second device mesa 34 by isolation trench 32. Isolation trench 30 isolates the second guard ring region 38 from the surrounding field epitaxial region 44. An NBL 60 extends into the second guard ring region 38, and a CN 54 is implanted into the second guard ring region 38. Metal contacts 56 are made to the CN 54 of the second guard ring region 38 to provide a low resistance RF ground along conductor 58. The conductors 58 are preferably coupled to an RF ground node.

The first and second guard ring regions 36, 38 provide excellent RF isolation. One reason for this excellent RF isolation is that electric fields created by RF power are terminated by the shunt to RF ground conductors 52, 58. Having these RF grounds around the first and second device mesas 28, 34 greatly improves RF isolation. Another reason for the excellent RF isolation is the use of SOI. The insulating layer 42 provides additional RF isolation. Finally, the use of a high resistivity (or high Z) substrate 40 improves RF isolation by making the substrate 40 a high resistance path for RF power. Any leaking RF power will prefer the path of least resistance which will not be the substrate 40 if a high Z substrate is used.

The first guard ring region 36 is completely isolated by the trenches 24 and 26 and the insulating layer 42. Similarly, the second guard ring region 38 is completely isolated by the trenches 30 and 32 and the insulating layer 42. This allows for easy bias of the first and second guard ring regions 36 and 38. The low resistivity guard ring regions 36 and 38 provide an excellent RF ground shunt. Furthermore, the low capacitance guard ring structures 36 and 38 have a small impact on junction capacitance Cjs. Specifically, the guard ring region 36 has little impact on Cjs because Cjs is dominated by the oxide in the trench 26 surrounding the device mesa 28. The heavily doped guard ring region 36 helps keep the region around the device mesa 28 at an AC or RF ground potential. The substrate 40, if a high resistivity or "high Z" (e.g. 1 KΩ-cm) substrate, contributes less to Cjs than standard resistivity (10–30 Ω-cm) material. In addition, with a high Z substrate 40, RF power will take the path of least resistance through the lower resistivity epitaxial layer 44. This RF power is then shunted out to ground through the guard ring region 36. Also, since the Cjs (with a high Z substrate) is now dominated by the side wall trench 26, additional RF power that leaks will go out the side as opposed to the substrate 40. The same is true for the guard ring region 38.

In order to illustrate the manner in which the present invention improves device to device isolation (such as RF power isolation), the isolation between the first device mesa 28 and the second device mesa 34 will now be examined. In general, RF power which leaks from the device mesa 28 will follow the path of least resistance. If the substrate 40 is a high resistivity (high Z) substrate, the RF power will prefer to flow through the epitaxial region 44. The RF power will eventually be shunted to ground out of guard ring region 38.

Specifically, arrow 62 shows the power created by the first device mesa 28. The power goes into the SOI substrate 22 in the direction of arrow 62. Any power that manages to go through trench 26 as indicated by arrow 64 gets shunted to ground through conductor 52 as indicated by arrow 66. Thus, this power will not reach the second device mesa 34. Some power may also manage to go through the insulating layer 42 as indicated by arrow 68. This power can be conducted laterally through the silicon support substrate 40 as indicated by arrow 70. If, however, the substrate 40 is a high resistivity (high Z) substrate, the RF power which leaks from device mesa 28 will prefer the epitaxial region 44 (path of least resistance) over the substrate 40. Even RF power that is injected directly into the substrate 40 will move into the epitaxial region 44 because that is the path of least resistance. Thus, the RF power will go back through the insulating layer 42 into the epitaxial region 44 as indicated by arrow 74 as soon as it has passed under the guard ring region 36. If this power manages to go through trench 30, however, it will be shunted to ground through conductor 58 as indicated by arrow 76. Thus, this power will also not reach the second device mesa 34.

The RF power in the support substrate 40 will continue along path 72 only if the support substrate 40 is of a standard resistivity (10–30 Ω-cm) material and not high Z. In this scenario, the RF power in the support substrate 40 can go back through the insulating layer 42 under the second device mesa 34 as indicated by arrow 78. This power, however, will be greatly attenuated after leaving the first device mesa 28 because it will have had to go through the insulating layer 42 twice.

The process for manufacturing the semiconductor IC 20 will be described with reference to FIGS. 4 to 8. First, the support substrate 40 is prepared and formed with the insulating layer 42 over its main surface. The insulating layer 42 may be formed, for example, of a silicon oxide film. This silicon oxide film is formed by thermally oxidizing the support substrate 40.

In order to form the NBL 46, a semiconductor substrate (not shown) is laid over the main surface of the insulating layer 42. The semiconductor substrate is adhered to the insulating layer 42 by a heat treatment, following which, the semiconductor substrate has its upper surface etched by a polishing treatment to have its thickness reduced. The semiconductor substrate thus thinned is doped all over its main surface with an n-type impurity by, for example, ion implantation. After this, the semiconductor substrate is thermally diffused to form the $n^+$-type buried layer 46. Anisotropic etching, such as Reactive Ion Etching (RIE), may be used to etch the NBL 46 to form the structure shown in FIG. 5.

Figure 6:
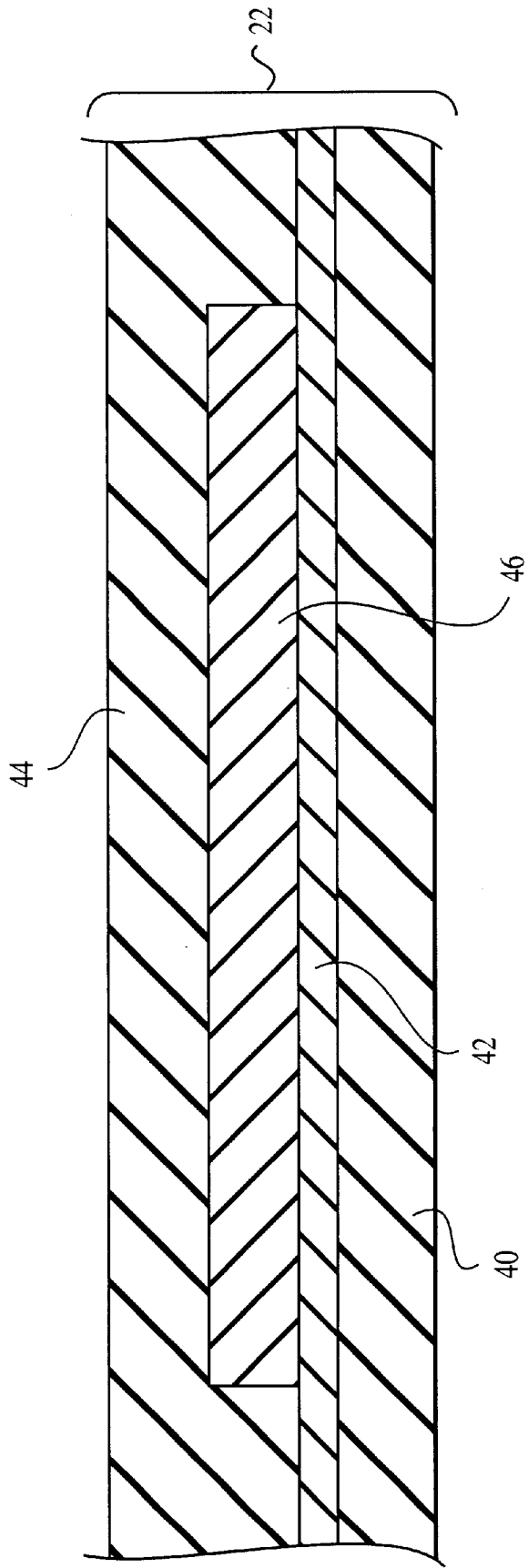

Referring to FIG. 6, the $n^-$-type epitaxial layer 44 is grown by epitaxial growth all over the surface of the NBL 46. The NBL 46 has its n-type impurity slightly diffused into the $n^-$-type epitaxial layer 44. This results in the SOI substrate 22 having a multi-layered structure that includes the NBL 46 and the $n^-$-type epitaxial layer 44 laid over the main surface of the insulating layer 42. The epitaxial layer 44 and the NBL (buried layer) 46 are examples of additional semiconductor layers that may be formed on the insulating layer 42.

Figure 7:
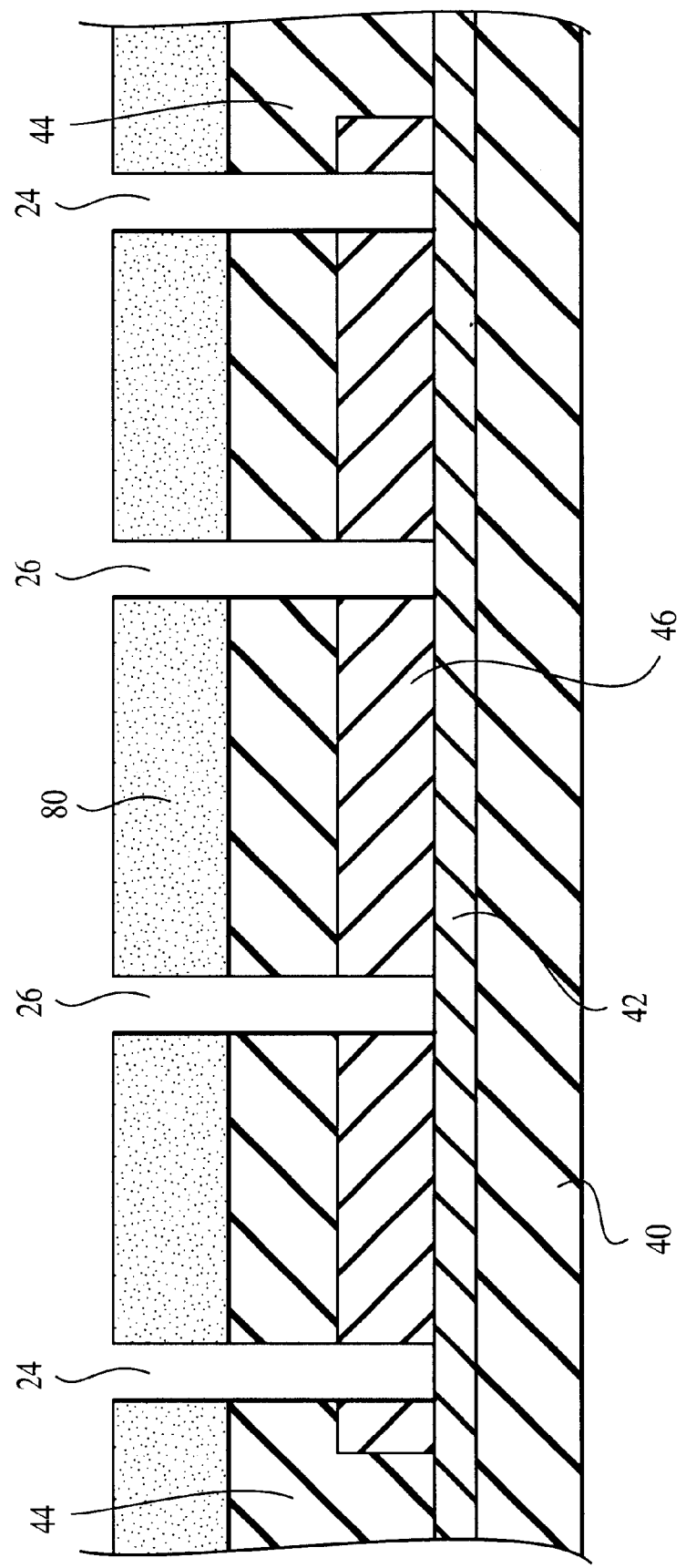

Referring to FIG. 7, the trenches 24 and 26 are formed by anisotropic etching, such as for example RIE. Specifically, the trenches 24 and 26 extend from the main surface of the epi layer 44 to the insulating layer 42. A photoresist 80 may be used as a mask for the etching. Alternatively, a hard mask may be used as a mask for the etching in place of the photoresist 80. After the photoresist 80 is removed, an insulator is buried in the trenches 24 and 26. This insulator is formed, for example, by depositing a silicon oxide film all over the main surface of the epi layer 44 by the CVD method and by etching back the whole surface of the silicon oxide film. An etch-back is carried out as thick as the deposited silicon oxide film to bury the trenches 24 and 26 with the silicon oxide. The silicon oxide film is over-etched off except from the inside of the trenches 24 and 26. The trenches 24 and 26 could also be filled with other materials, such as for example, oxide/polysilicon.

Figure 8:
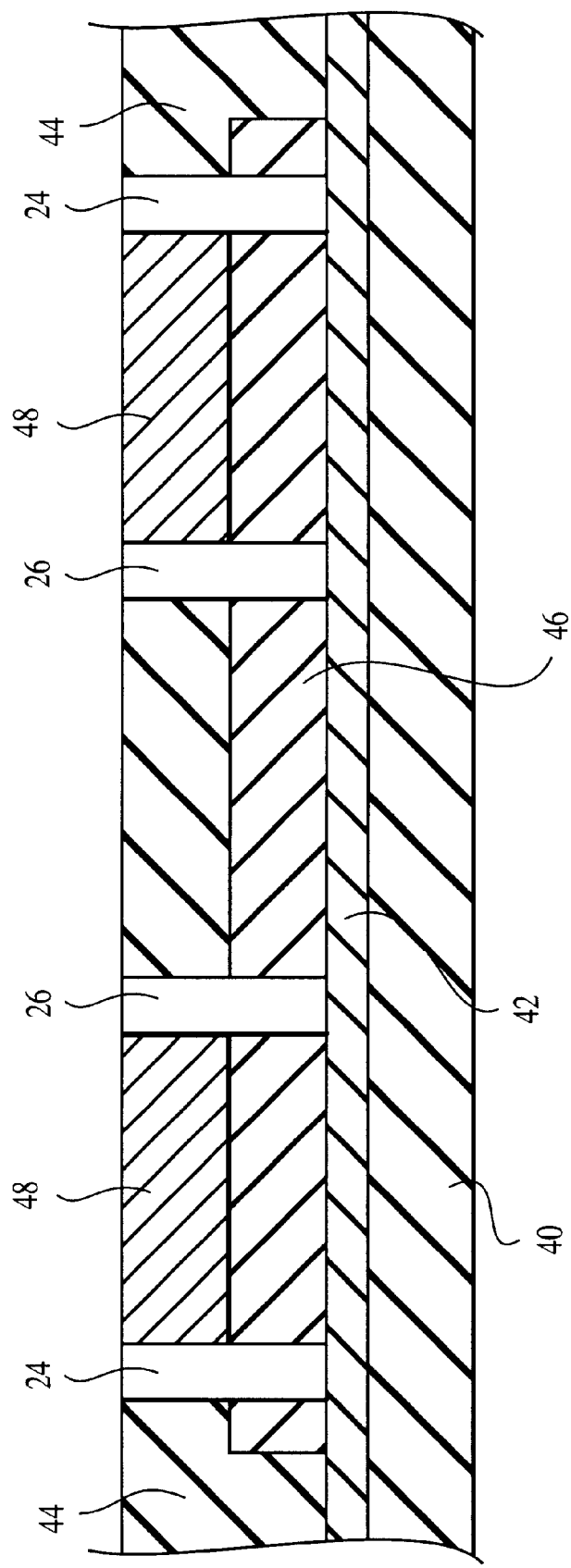

Referring to FIG. 8, the n-type collector (CN) 48 is implanted into the first guard ring region 36. Specifically, the surface of the region 48 may be selectively doped with an n-type impurity (e.g., phosphor) by ion implantation. Thermal diffusion is carried out to form the n-type collector 48 in the epitaxial layer 44. The CN 48 is preferably heavily doped. It should be understood that the collector 48 may alternatively be formed from p-type material. Finally, the metal contacts 50 are made to the n-type collector 48, and the conductors 52 are attached, to form the structure shown in FIG. 2.

It should be understood that any type of semiconductor element or elements may be formed in the first device mesa 28. The semiconductor element or elements may be active, passive, or a combination of both. For example, the first device mesa 28 may include one or more transistors, diodes, capacitors, resistors, etc.

An example of one particular SOI technology that may be used in the present invention is the bonded SOI BiCMOS process technology mentioned above, namely, the SOI BiCMOS process technology that is available from Hitachi Ltd. of Japan, and specifically, the Hitachi Ltd. Device Development Center in Tokyo, Japan. As mentioned above, this SOI BiCMOS process technology is also described in U.S. Pat. Nos. 5,661,329, 5,773,340, and 5,430,317, the complete disclosures of which are all hereby fully incorporated into the present application by reference. Specifically, it has been found that this silicon-on-insulator (SOI) BiCMOS technology has many characteristics that are preferable to alternative technologies. There are also several features that make it particularly well-suited to RF applications. With SOI, the insulating layer separates circuit devices from the solid silicon substrate. A trench isolation structure may also be used which provides a lateral barrier between circuit elements. These features isolate signals and minimize the undesired coupling that would otherwise limit performance. Because parasitic effects also limit the speed at which a circuit can operate, ICs made with SOI offer exceptional high-frequency operation while minimizing power dissipation. Finally, the isolating properties of the SOI technology allow more functions to be packed into a smaller area. These characteristics translate into advantages in performance, battery life, and size for the end product.

Figure 9:
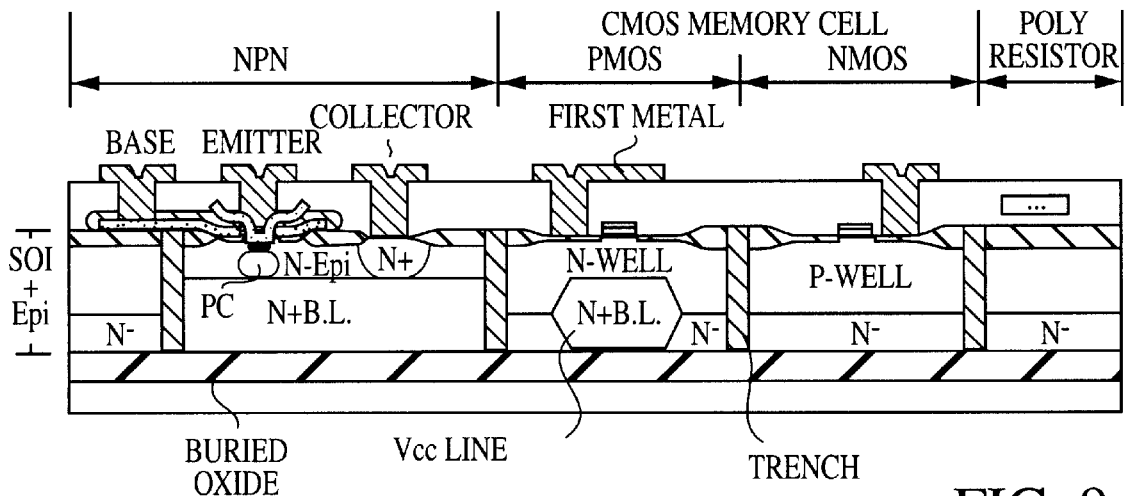
FIG. 9 is a cross-sectional view of semiconductor devices fabricated using a silicon-on-insulator (SOI) process technology.
Figure 10:
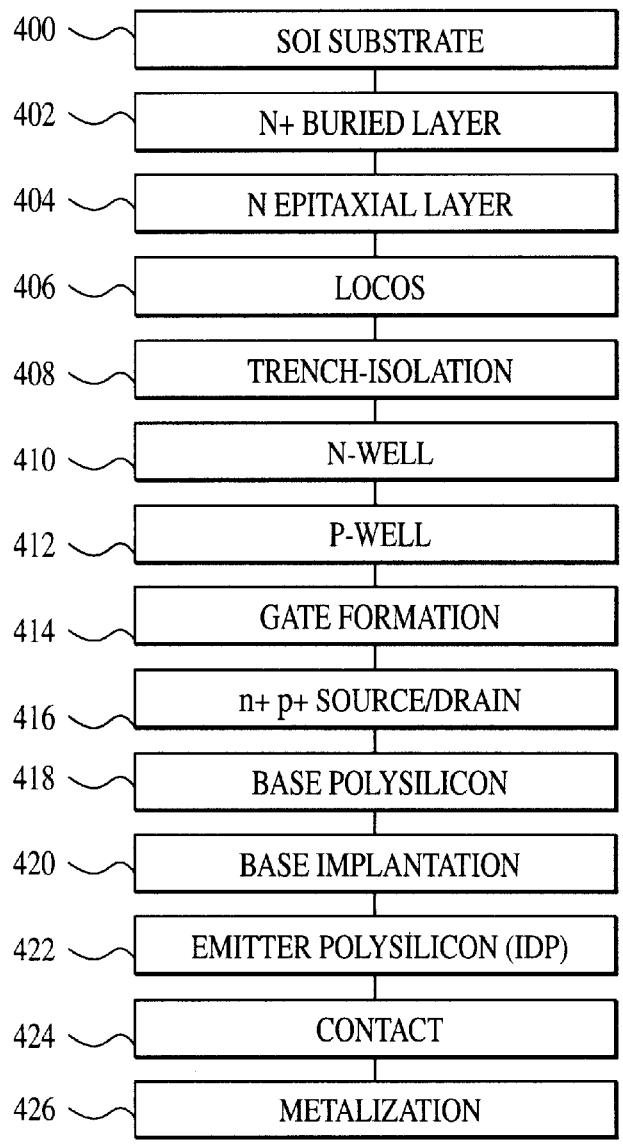
FIG. 10 is a flow diagram illustrating the process steps used to fabricate the semiconductor devices shown in FIG. 9.

Referring to FIG. 9, there is illustrated a cross-section of the ECL-CMOS process technology discussed in the paper entitled "A 0.35 $\mu$m ECL-CMOS Process Technology on SOI for 1 ns Mega-bits SRAM's with 40 ps Gate Array" mentioned above. FIG. 10 illustrates the general process steps discussed in that same paper.

As stated in the paper, FIG. 9 shows the cross-sectional view of a 0.35 $\mu$m ECL-CMOS process technology. A bipolar transistor, 1 bit CMOS memory cell and poly resistor are shown. Three key technologies adopted for this device are SOI substrate, trench isolation and the IDP (In-situ phosphorus doped polysilicon) emitter technology. The bipolar transistor includes double polysilicon self-aligned structure with IDP emitter and the pedestal collector. IDP can avoid the plug effects which causes $f_r$ degradation in a small size emitter. To reduce CMOS memory cell size and to achieve a latch-up free configuration, n+ buried layer for the Vcc line and a trench isolation combined with LOCOS are used.

Referring to FIG. 10, the fabrication process begins in step 400 with the SOI substrate. The starting material is a SOI substrate with 1.5 $\mu$m thick Si layer and 0.5 $\mu$m buried oxide layer. The buried layer is formed in step 402, and the epitaxial layer is formed in step 404. Only n+region is prepared for a buried layer. The voltage drop of buried Vcc line is small enough by reducing sheet resistance of the n+layer down to about 45Ω/square. A 0.7 $\mu$m thick epitaxial layer is grown. The LOCOS is formed in step 406, and the trench isolation is formed in step 408. The thickness of LOCOS oxidation is 0.4 $\mu$m. The trench is formed after LOCOS oxidation. The width of the trench is 0.4 $\mu$m. It is filled and planarized with CVD oxide film. The N-wells and P-wells are formed in steps 410, 412, respectively. The n-well and p-well are formed by high-energy implantation through LOCOS with two masks. Channel implantation is performed simultaneously to control threshold voltage Vth of NMOS and PMOS. The gate is formed in step 414, and the source and collector is formed in step 416. Gate electrodes are formed by $Wsi_2$/polysilicon structure. The thickness of gate oxide is 9 nm. After the gate patterning, the source and drain region is formed. The base is formed in steps 418, 420, and the emitter is formed in step 422. The base and emitter of the bipolar are fabricated by the self-aligned process. Base polysilicon is deposited and a hole is formed in the emitter region. Then, intrinsic base implantation and pedestal collector implantation are carried out. After sidewall spacer of polysilicon was formed, the emitter electrode and shallow emitter were fabricated simultaneously using IDP technology with rapid thermal annealing (RTA) at 950° C. An SOG etch-back technique is used for planarization after PSG deposition and a contract hold formation is followed in step 424. Finally, six layers of metalization is performed in step 426.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of providing radio frequency (RF) isolation of device mesas within an integrated circuit (IC), wherein the IC comprises a substrate, an insulating layer formed on the substrate, additional semiconductor layers formed on the insulating layer, a first isolation trench formed in the additional semiconductor layers that extends to the insulating layer and that surrounds a first selected surface area of the additional semiconductor layers, wherein the first selected surface area defines a first device mesa, a second isolation trench formed in the additional semiconductor layers that extends to the insulating layer and that surrounds the first isolation trench and defines a first guard ring region between itself and the first isolation trench, a third isolation trench formed in the additional semiconductor layers that extends to the insulating layer and that surrounds a second selected surface area of the additional semiconductor layers, wherein the second selected surface area defines a second device mesa, and wherein the device mesas each include an integrated circuit device capable of generating RF power, and a fourth isolation trench formed in the additional semiconductor layers that extends to the insulating layer and that surrounds the third isolation trench and defines a second guard ring region between itself and the third isolation trench, the method comprising the steps of:

a) isolating the first device mesa from RF power produced by integrated circuit devices external to the first device mesa, wherein the RF power comprises relatively high-frequency small voltage signals, by electrically coupling the first guard ring region to a ground node thereby shunting the RF power to ground and greatly reducing effects of the RF power on the operation of the device in the first device mesa; and b) isolating the second device mesa from RF power produced by integrated circuit devices external to the second device mesa by electrically coupling the second guard ring region to the ground node thereby shunting the RF power to ground and greatly reducing effects of the RF power on the operation of the device in the second device mesa;

wherein RF isolation is firther provided between the first and second device mesas by shunting the RF power produced by the devices operating within the device mesas to ground.

2. The method as defined by claim 1, wherein the additional semiconductor layers comprise:

a) a buried layer formed on the insulating layer; and b) an epitaxial layer of a first conductivity type formed on the buried layer.

3. The method as defined by claim 1, wherein the IC device further comprises:

a) a first collector implanted into the first guard ring region;

b) a second collector implanted into the second guard ring region;

c) a first contact made to the first collector to which the ground node is coupled; and d) a second contact made to the second collector to which the ground node is coupled.

4. The method as defined by claim 1, wherein the ground node comprises an RF ground node.

5. The method as defined by claim 1, wherein the substrate comprises a high resistivity substrate.

6. A method of providing radio frequency (RF) isolation of device mesas within an integrated circuit (IC), wherein the IC comprises a substrate, an insulating layer formed on the substrate, a buried layer formed on the insulating layer, an epitaxial layer of a first conductivity type formed on the buried layer, a first isolation trench formed in the epitaxial layer and the buried layer that extends to the insulating layer and that surrounds a first selected surface area of the epitaxial layer, wherein the first selected surface area defines a first device mesa, a second isolation trench formed in the epitaxial layer and the buried layer that extends to the insulating layer and that surrounds the first isolation trench and defines a first guard ring region between itself and the first isolation trench, a third isolation trench formed in the epitaxial layer and the buried layer that extends to the insulating layer and that surrounds a second selected surface area of the epitaxial layer, wherein the second selected surface area defines a second device mesa, and wherein the device mesas each include an integrated circuit device capable of generating RF power, a fourth isolation trench formed in the epitaxial layer and the buried layer that extends to the insulating layer and that surrounds the third isolation trench and defines a second guard ring region between itself and the third isolation trench, a first collector implanted into the epitaxial layer in the first guard ring region, a second collector implanted into the epitaxial layer in the second guard ring region, and a contact made to the first and second collectors, the method comprising the steps of:

a) isolating the first device mesa from RF power produced by integrated circuit devices external to the first device mesa, wherein the RF power comprises relatively high-frequency small voltage signals, by electrically coupling the first guard ring region to a ground node thereby shunting the RF power to ground and greatly reducing effects of the RF power on the operation of the device in the first device mesa; and b) isolating the second device mesa from RF power produced by integrated circuit devices external to the second device mesa by electrically coupling the second guard ring region to the ground node thereby shunting the RF power to ground and greatly reducing effects of the RF power on the operation of the device in the second device mesa;

wherein RF isolation is further provided between the first and second device mesas by shunting the RF power produced by the devices operating within the device mesas to ground.

7. The method as defined by claim 6, wherein the substrate comprises a high resistivity substrate.

* * * * *